(12) United States Patent
Zamprogno et al.

(10) Patent No.: US 10,187,026 B2
(45) Date of Patent: Jan. 22, 2019

(54) TRANSMIPEDANCE AMPLIFIER CIRCUIT, RELATED INTEGRATED CIRCUIT, RECEIVER CIRCUIT AND METHOD OF OPERATING A TRANSIMPEDANCE AMPLIFIER CIRCUIT

(71) Applicant: STMicroelectronics S.r.l., Agrate Brianza (IT)

(72) Inventors: Marco Zamprogno, Cesano Maderno (IT); Maurizio Bongiorni, Buccinasco (IT); Pasquale Flora, Varese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/587,579

(22) Filed: May 5, 2017

(65) Prior Publication Data
US 2018/0131342 A1 May 10, 2018

(30) Foreign Application Priority Data
Nov. 9, 2016 (IT) .................... 102016000113107

(51) Int. Cl.
*H03F 3/08* (2006.01)
*H03G 3/30* (2006.01)
(Continued)

(52) U.S. Cl.
CPC ............ *H03G 3/30* (2013.01); *H02J 7/0063* (2013.01); *H03F 3/087* (2013.01);
(Continued)

(58) Field of Classification Search
CPC ............ H03F 3/08; H03F 3/082; H03F 3/087
(Continued)

(56) References Cited

U.S. PATENT DOCUMENTS 5,471,665 A * 11/1995 Pace .................. H03D 3/008
330/259
5,793,230 A * 8/1998 Chu .................. H03K 5/007
327/307

(Continued)

OTHER PUBLICATIONS

Put J et al: "10 Gbit/s burst-mode limiting amplifier with switched time constants for fast settling and large CID tolerance", Electronics LET, IEE Stevenage, GB, vol. 47, No. 17, Aug. 18, 2011, pp. 970-972.

(Continued)

*Primary Examiner* — Steven J Mottola
(74) *Attorney, Agent, or Firm* — Crowe & Dunlevy

(57) ABSTRACT

A transimpedance amplifier circuit includes a feedback control loop that generates a compensation current at an input of a transimpedance amplifier. The feedback control loop includes a differential integrator with an integration capacitor. A time constant associated with charging the integration capacitor is variable as a function of a pre-charge control signal. During a pre-charge phase, the pre-charge control signal is set to a first value so as to set the time constant associated with charging the integration capacitor to a first time constant value. During an operation phase, the pre-charge control signal is set to a second value so as to increase the time constant associated with charging the integration capacitor to a second time constant value greater than the first time constant value for the pre-charge phase.

23 Claims, 7 Drawing Sheets

(51) Int. Cl.
*H02J 7/00* (2006.01)
*H03F 3/45* (2006.01)
*H04B 10/69* (2013.01)
*H02J 7/34* (2006.01)

(52) U.S. Cl.
CPC ..... *H03F 3/45475* (2013.01); *H03F 3/45973* (2013.01); *H03F 3/45977* (2013.01); *H04B 10/6933* (2013.01); *H02J 7/345* (2013.01); *H03F 2203/45021* (2013.01); *H03F 2203/45114* (2013.01); *H03F 2203/45116* (2013.01); *H03F 2203/45212* (2013.01); *H03F 2203/45288* (2013.01); *H03F 2203/45528* (2013.01); *H03F 2203/45536* (2013.01)

(58) Field of Classification Search
USPC ................. 330/308; 250/214 A, 214 AG
See application file for complete search history.

(56) References Cited

U.S. PATENT DOCUMENTS

| | | |
|---|---|---|
| 2004/0119539 A1 | 6/2004 | Seetharaman et al. |
| 2010/0231295 A1 | 9/2010 | Hara |
| 2014/0291487 A1 | 10/2014 | Laforce |
| 2016/0261246 A1 | 9/2016 | Koizumi et al. |

OTHER PUBLICATIONS

IT Search Report and Written Opinion for IT 102016000113107 dated Jun. 30, 2017 (9 pages).
Transimpedance amplifier; https://en.wikipedia.org/wiki/Transimpedance_amplifier, printed Apr. 19, 2017 (5 pages).

* cited by examiner

TRANSMIPEDANCE AMPLIFIER CIRCUIT, RELATED INTEGRATED CIRCUIT, RECEIVER CIRCUIT AND METHOD OF OPERATING A TRANSIMPEDANCE AMPLIFIER CIRCUIT

PRIORITY CLAIM

This application claims the priority benefit of Italian Application for Patent No. 102016000113107, filed on Nov. 9, 2016, the disclosure of which is hereby incorporated by reference in its entirety.

TECHNICAL FIELD

Embodiments of the present disclosure relate to transimpedance amplifier circuits. Specifically, various embodiments of the present disclosure relate to techniques for cancelling the DC/low frequency offset at the input of a transimpedance amplifier.

BACKGROUND

FIG. 1 shows an optical system, which comprises an optical transmitter circuit 1 and an optical receiver circuit 3.

In the example considered, the transmitter circuit 1 comprises a signal generator (SG) 10 and transmission means 12 for generating an optical waveform, such as a LED (Light Emitting Diode) or a laser diode, e.g. operating in the infrared (IR) light region, i.e. the transmission means 12 may be an IR LED.

For example, the signal generator 10 may drive the transmission means 12 in order to transmit a pulse P by generating a corresponding light pulse, e.g. in the order of hundreds of ns (nanoseconds), e.g. between 100 and 500 ns.

The optical receiver circuit 3 comprises a light sensor PD, such as a photodiode, e.g. an IR photodiode, which is connected to a transimpedance amplifier (TIA) 32.

Generally, the light sensor PD is arranged to receive the light generated by the transmission means 12.

Accordingly, in the example considered, the transimpedance amplifier 32 converts the current provided by the photodiode PD into a corresponding voltage signal $V_{out}$ being indicative of the intensity of light received by the photodiode PD.

In the example considered, a processing circuit (PC) 36, which generally may be any analog and/or digital circuit, such as a micro-processor, e.g. a DSP (Digital Signal Processor), may elaborate the voltage signal $V_{out}$ in order to detect the light pulse in the received signal.

Generally, also further analog and/or digital signal processing (SP) stages 34 may be provided between the transimpedance amplifier 32 and the processing circuit 36, such as one or more amplifier stages and/or filters, such as bandpass filters, and/or an analog-to-digital converter.

FIG. 2 shows a second example of a receiver circuit 3.

Specifically, in the example considered, the optical receiver circuit 3 comprises a plurality of light sensors, such as three photodiodes $PD_1$, $PD_2$ and $PD_3$, e.g. IR photodiodes, which are connected through switching means 30 to the input of the same transimpedance amplifier 32.

Generally, the switching means 30 may be configured to connect a subset of the light sensors $PD_1$, $PD_2$ and $PD_3$ to the input of the transimpedance amplifier 32. For example, in various applications, at each instant, only a single light sensor $PD_1$, $PD_2$ and $PD_3$ is connected to the input of the transimpedance amplifier 32. For example, these multiple photodiodes $PD_1$, $PD_2$ and $PD_3$ may be placed in a given area in order to "map" the space with a proper resolution. In fact, each photodiode can provide a related spatial information by reading a certain TX pulse amplitude. In order to minimize the number of receivers (area, consumption, etc.) several photodiodes $PD_1$, $PD_2$ and $PD_3$ can be multiplexed on the same receiver. In this case only one photodiode will be connected to the receiver at each time.

Accordingly, in the example considered, the transimpedance amplifier 32 converts the current provided by the photodiode PD currently connected to the input of the transimpedance amplifier 32 into a corresponding voltage signal $V_{out}$ being indicative of the intensity of light received by the respective photodiode(s) PD.

FIG. 2 shows also a possible connection of the photodiodes $PD_1$, $PD_2$ and $PD_3$ to the input of the transimpedance amplifier 32. Specifically, in the example considered, each of the photodiodes $PD_1$, $PD_2$ and $PD_3$ is connected with its cathode to a constant voltage $V_{PD}$ and with its anode via the switching means 30 to the input of the transimpedance amplifier 32. For example, the switching means 30 may comprise a respective electronic switch $SW_1$, $SW_2$ and $SW_3$ for each of the photodiodes $PD_1$, $PD_2$ and $PD_3$, which permit to:

- connect the anode of a respective photodiode $PD_1$, $PD_2$ or $PD_3$ to the input of the transimpedance amplifier 32, or
- disconnect the anode of the respective photodiode $PD_1$, $PD_2$ or $PD_3$ from the input of the transimpedance amplifier 32.

Accordingly, in the example considered, the photodiodes $PD_1$, $PD_2$ and $PD_3$ (when connected through the switch to the transimpedance amplifier input virtual ground) are biased in the reverse region and will thus produce a background current (also called dark current), i.e. each of the photodiodes PD will produce also a current, when none of the transmission means 12 generates a light pulse. For example, the amplitude of the input current signal generated by the light pulse may generate a current variation in the range of 1-2 uA (microampere), which is significantly smaller than the background current, which is often in the range of hundreds of uA.

Generally, a similar problem may also arise due to ambient light. In fact, in many applications the current provided to the input of the transimpedance amplifier 32 will have an DC offset on which is modulated some kind of signal, e.g. the effect of the pulse P shown in FIG. 1.

Accordingly, after a settling time, in which the amplifier 32 should be able to cancel this DC-like background current, the transmission diode 12 can generate a light pulse that will be received by the photodiode PD and converted into a proportional current pulse, which is fed to the input of the TIA 32.

For example, as shown in FIG. 3, a transimpedance amplifier circuit 32 with DC offset cancellation may be implemented with a transimpedance amplifier 320.

Specifically, in the example considered, the amplifier circuit 32 comprises an input IN for receiving an input current $I_{IN}$ and an output OUT for providing an output voltage $V_{out}$. In the example considered, the input current $I_{IN}$ is fed to the input of the transimpedance amplifier 320, which thus generates the output voltage $V_{out}$ at the output.

The output voltage $V_{out}$ is also fed to feedback control loop comprising an integrating error amplifier 324, which generates via a current source 328 a compensation current $I_{DC}$, which is also fed to the input of the transimpedance amplifier 320, i.e. the transimpedance amplifier 320 receives at input a current $I_{TIA}$ corresponding to:

$$I_{TIA} = I_{IN} + I_{DC} \qquad (1)$$

Specifically, the error amplifier 324 generates a feedback control signal for the current source 328 by comparing the output voltage $V_{out}$ with a reference voltage $V_{ref}$. Accordingly, in the example considered, the error amplifier 324 will vary the current $I_{DC}$ provided by the current source 328 until the output voltage $V_{out}$ corresponds to the reference voltage $V_{ref}$.

In the example considered, low-pass (LP) filters 322 and/or 326 may be arranged at the input and/or the output of the error amplifier 324, respectively, thereby using only the DC offset as basis for the generation of the compensation current $I_{DC}$ at the input of the transimpedance amplifier 320.

Reference is also made, for example, to United States Patent Application Publication No. 2004/0119539 (incorporated by reference) which discloses various solutions of a transimpedance amplifier with DC offset cancellation.

There is a need in the art to provide solutions for improving the DC/low frequency offset cancellation at the input of a transimpedance amplifier.

SUMMARY

In an embodiment, a transimpedance amplifier circuit comprises an input terminal for receiving an input current and an output terminal for providing an output voltage. The input terminal is connected to a transimpedance amplifier configured to provide at output the output voltage, whereby the output voltage is indicative of the current received at the input of the transimpedance amplifier.

In various embodiments, the transimpedance amplifier circuit comprise a feedback control loop configured to generate a compensation current at the input of the transimpedance amplifier in order reduce or cancel the DC/low frequency part of the input current. Specifically, in various embodiments, the feedback control loop comprises a differential integrator generating a feedback signal by comparing the output voltage with a reference voltage. In various embodiments, the feedback control loop moreover comprises a current generator configured to generate said compensation current as a function of the feedback signal.

In various embodiments, the differential integrator comprises at least one integration capacitor. Specifically, in various embodiments, the transimpedance amplifier circuit may be configured such that the time constant associated with the charging of the at least one integration capacitor is variable as a function of a pre-charge control signal.

In this case, the transimpedance amplifier circuit may comprise a processing circuit configured to generate the pre-charge control signal, wherein:

during a pre-charge phase, the pre-charge control signal is set to a first value, thereby setting the time constant associated with the charging of the at least one integration capacitor to a respective first time constant, and during an operation phase, the pre-charge control signal is set to a second value, thereby increasing the time constant associated with the charging of the at least one integration capacitor with respect to the pre-charge phase.

For example, in various embodiments, the differential integrator comprises an integrating error amplifier comprising an operational amplifier, wherein a first input of the operational amplifier is connected via a first resistor to a reference voltage and a second input of the operational amplifier is connected to the output voltage. In this case, a first integration capacitor may be connected between the output terminal of the operational amplifier and the first input of the operational amplifier. For example, the time constant of the charging may be variable by using a resistor having a resistance being settable as a function of the pre-charge control signal for the first resistor.

In various embodiments, the differential integrator may comprise a low-pass filter arranged at the second input of the operational amplifier, wherein the low-pass filter comprises a second resistor and a second integration capacitor. Accordingly, also the second resistor may be a resistor having a resistance being settable as a function of the pre-charge control signal.

In various embodiments, the transimpedance amplifier circuit comprises an offset compensation capacitor connected with a first terminal to the second input of the operational amplifier and with a second terminal to an electronic switch configured to connect the second terminal of the offset compensation capacitor either to the reference voltage or the second resistor as a function of an offset compensation signal. In this case, the processing circuit may be configured to generate also the offset compensation signal in order to connect the offset compensation capacitor in parallel with the second resistor during an offset compensation phase following the pre-charge phase.

In various embodiments, the transimpedance amplifier circuit comprises means configured to selectively discharge the at least one integration capacitor as a function of a reset signal. In this case, the processing circuit may be configured to generate the reset signal in order to discharge the at least one integration capacitor during a reset phase preceding the pre-charge phase.

In various embodiments, also the behavior of the transimpedance amplifier may be adapted. For example, the transimpedance amplifier may have a gain being variable at least as a function of the pre-charge control signal. For example, in various embodiments, the transimpedance amplifier may comprise an operational amplifier, wherein a first input of the operational amplifier is connected to the input terminal and a second input of the operational amplifier is connected to the reference voltage, and wherein a third resistor is connected between the output terminal of the operational amplifier and the first input of the operational amplifier. For example, also in this case, the third resistor may be a resistor having a resistance being settable as a function of said pre-charge control signal.

In various embodiments, the transimpedance amplifier circuit may also comprise a further control loop activated during a pre-compensation phase preceding the pre-charge phase. For example, the further control loop may comprise a plurality of constant current sources selectively connectable to the input of the transimpedance amplifier, a comparator configured to generate a comparison signal indicating whether the output voltage is smaller than a given threshold, and a control unit configured to selectively connect sub-sets of the constant current sources to the input of the transimpedance amplifier, thereby increasing the current provided by said plurality of constant current sources, until the comparison signal indicates that the output voltage is smaller (or greater, depending on the adopted convention) than a given threshold.

Accordingly, in various embodiments, the processing circuit may execute the following steps:

during a pre-charge phase, setting the pre-charge control signal to a first value, thereby setting the time constant associated with the charging of the at least one integration capacitor to a respective first time constant, and during a following operation phase, setting the pre-charge control signal to a second value, thereby increasing the time constant associated with the charging of the at least one integration capacitor with respect to said pre-charge phase.

Accordingly, in various embodiments, the feedback control loop has a smaller settling time for the reduction or cancellation of the DC/low frequency part of the input current during the pre-charge phase, and the feedback control loop is maintained stable during said operation phase.

BRIEF DESCRIPTION OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
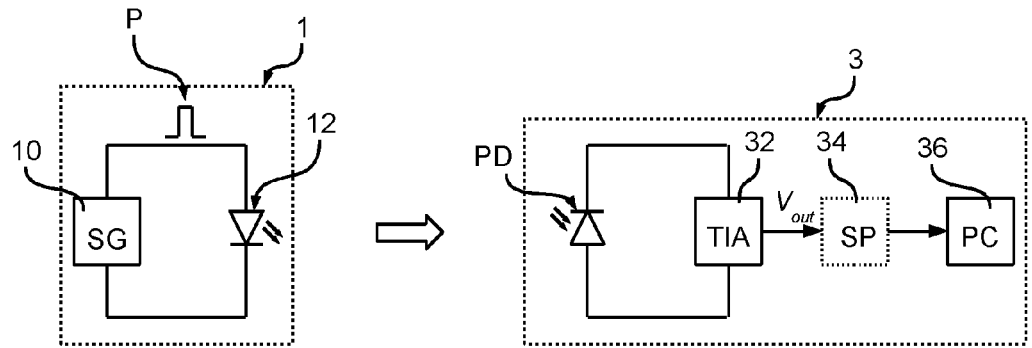
FIGS. 1, 2 and 3 show an optical system with details of a receiver circuit.
Figure 2:
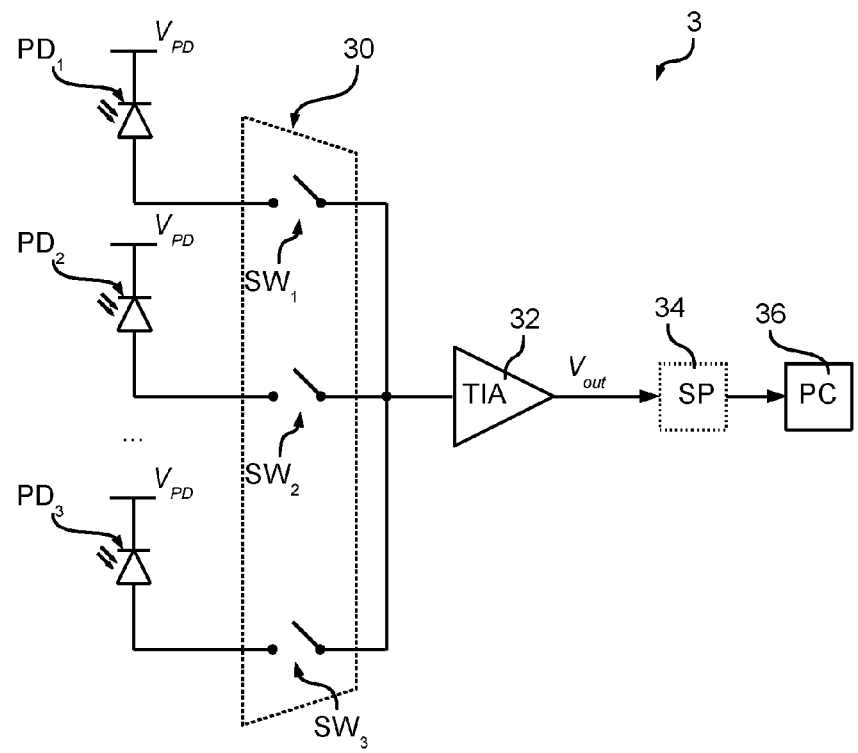
Figure 3:
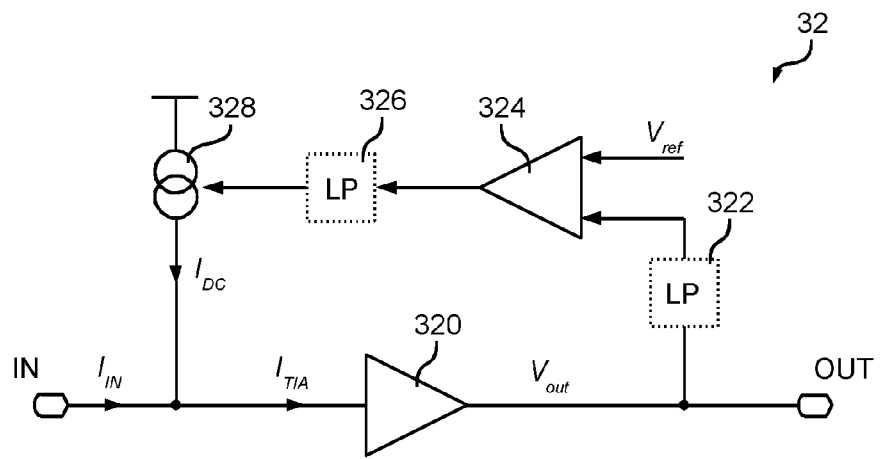

In the following FIGS. 4 to 14, the parts, elements or components which have already been described with reference to FIGS. 1 to 3 are denoted by the same references previously used; the description of such previously described elements will not be repeated in the following in order not to overburden the present detailed description.

As mentioned in the foregoing, various embodiments of the present disclosure relate to a transimpedance amplifier circuit with DC/low frequency input cancellation, to be used, e.g., as a transimpedance amplifier 32 in the optical systems shown in FIGS. 1 and 2. Generally, DC/low frequency input cancellation does not require that the DC/low frequency part of the input current has to be cancelled completely, but is at least reduced, thereby permitting a greater amplification of the variation of the input current.

Figure 4:
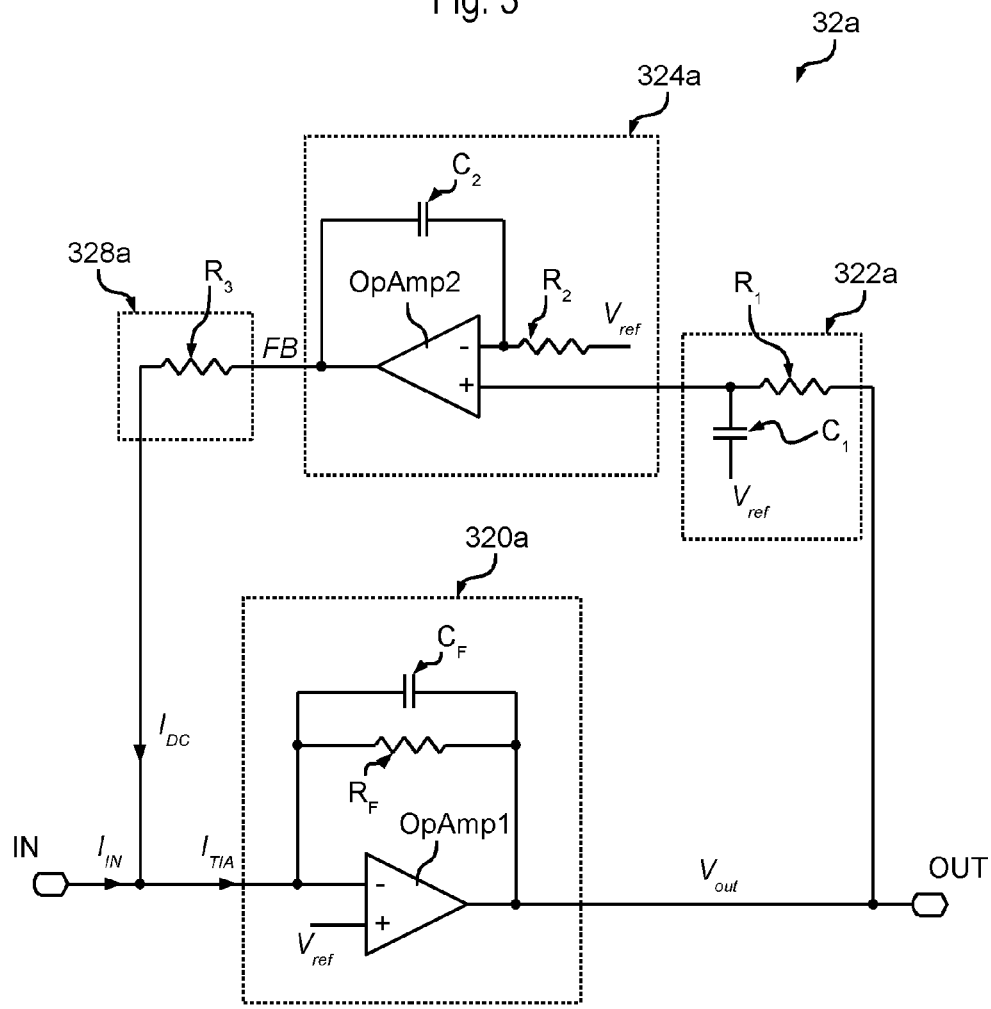
FIG. 4 shows a first embodiment of a transimpedance amplifier circuit.

FIG. 4 shows a first embodiment of a transimpedance amplifier circuit 32a with DC offset cancellation.

As mentioned in the foregoing, a transimpedance amplifier circuit 32a with DC offset cancellation may be implemented with a transimpedance amplifier 320a and a feedback loop generating a compensation current $I_{DC}$.

Specifically, in the embodiment considered, the transimpedance amplifier circuit 32a comprises an input IN for receiving an input current $I_{IN}$ and an output OUT for providing an output voltage $V_{out}$.

In the embodiment considered, the input current $I_{IN}$ may be provided by any current source 20 such as one or more photodiodes PD connected (e.g., directly) to the input IN of the amplifier circuit 32 (see e.g. FIG. 1). Moreover, as mentioned with respect to FIG. 2, a switching means 30 may be interposed between the current source and the input IN of the transimpedance amplifier circuit 32a. Generally, the switching means 30 may also be included in the package of the transimpedance amplifier circuit 32a.

In the embodiment considered, the transimpedance amplifier 320 is thus configured to receive at input a current $I_{TIA}$ corresponding to the sum of the input current $I_{IN}$ and the compensation current $I_{DC}$ and generate an output voltage $V_{out}$ being indicative of the current $I_{TIA}$.

For example, in the embodiment considered, the transimpedance amplifier 320a is implemented with an operational amplifier OpAmp1.

Specifically, in the embodiment considered, a closed loop configuration with negative feedback is used. For example, in various embodiments, the inverting/negative input of the operational amplifier OpAmp1 is connected (e.g. directly) to the input IN, and the non-inverting/positive input of the operational amplifier OpAmp1 is connected to a constant reference voltage $V_{ref}$. Finally, the feedback network between the output terminal of the operational amplifier OpAmp1 and the inverting input of the operational amplifier OpAmp1 comprises at least a resistor $R_F$ and optionally a capacitor $C_F$. For the operation of this circuit, reference can be made, for example, to United States Patent Application Publication No. 2014/0291487 (incorporated by reference), or to the description of a transimpedance amplifier provided at https://en.wikipedia.org/wiki/Transimpedance_amplifier (incorporated by reference). However, in general, also other types of transimpedance amplifiers may be used.

In the embodiment considered, the output voltage $V_{out}$ will thus correspond to the voltage $V_{ref}$ when no current $I_{TIA}$ is provided at the input of the transimpedance amplifier 320a.

In the embodiment considered, the output voltage $V_{out}$ is provided to a low pass filter 322a, such as a RC low-pass filter. For example, in the embodiment considered, the filter 322a comprises a resistor $R_1$ and a capacitor $C_1$ connected in series between the output OUT of the transimpedance amplifier circuit 320a, i.e. the output voltage $V_{out}$, and a constant voltage, such as e.g. the reference voltage $V_{ref}$.

Accordingly, in the embodiment considered, the intermediate point between the resistor $R_1$ and the capacitor $C_1$, generally representing the output of the low-pass filter 324a, provides a filtered version of the output voltage $V_{out}$, in which the high-frequency components have been removed. Generally, also other types of low-pass filters, including also active and/or multi-stage filters, may be used.

In the embodiment considered, the output of the filter 322a is connected to an integrating error amplifier 324a, representing a regulator with integral (I) component. Specifically, the error amplifier 324a is configured to generate a feedback control signal FB and vary (i.e. increase or decrease) this control signal FB until the filtered version of the output voltage $V_{out}$ corresponds to the reference voltage $V_{ref}$.

For example, in the embodiment considered, the error amplifier 324a is implemented with a second operational amplifier OpAmp2, with a capacitor $C_2$ in the feedback network.

Specifically, in the embodiment considered, the filtered version of the output voltage $V_{out}$, i.e. the output of the low-pass filter 322a, is connected to the non-inverting/positive input of the operational amplifier OpAmp2 and the reference voltage $V_{ref}$ is connected via a resistor $R_2$ to the inverting/negative input of the operational amplifier OpAmp2. In the embodiment considered, the integrating component of the error amplifier is implemented with the capacitor $C_2$ connected between the output of the operational amplifier OpAmp2 and the inverting/negative input of the operational amplifier OpAmp2.

Accordingly, in the embodiment considered, the low-pass filter 322a together with the analog integrator 324a implement a differential integrator. For this reason, in various embodiments, the resistance of the resistor $R_2$ corresponds to the resistance of the resistor $R_1$ and the capacitance of the capacitor $C_2$ corresponds to the capacitance of the capacitor $C_1$.

Accordingly, in the embodiment considered, the control signal FB at the output of the error amplifier 324a is a voltage signal.

Finally, in order to generate the compensation current, the control signal FB is sent to a current generator 328a configured to convert the control signal FB provided by the error amplifier 324a in the compensation current $I_{DC}$.

For example, in the embodiment considered, the current source 328a may be implemented with a resistor $R_3$ connected between the output of the error amplifier 324a, i.e. the output of the operational amplifier OpAmp2, and the input of the transimpedance amplifier 320a.

Accordingly, in the embodiment considered, the error amplifier 324a will increase or decrease the control signal FB (and thus the amplitude of the compensation current $I_{DC}$ injected at the input of the transimpedance amplifier 320a and having opposed sign with respect to the input current $I_{IN}$) until the filtered version of the output voltage $V_{out}$ corresponds to the reference voltage $V_{ref}$.

Specifically, in various embodiments considered, the output voltage $V_{out}$ corresponds to the reference voltage $V_{ref}$ when the current $I_{TIA}$ at the input of the transimpedance amplifier 320a is zero. For example, in the embodiment considered, this is ensured by means of the virtual ground of the operational amplifier OpAmp1, because the non-inverting input of the operational amplifier OpAmp1 is connected to the reference voltage $V_{ref}$. However, in general, the error amplifier 324a and the transimpedance amplifier 320a may operate with different reference voltages.

Thus, in the embodiment considered, in case a substantially constant current $I_{IN}$ is provided at the input IN of the amplifier circuit 32a, the error amplifier 324a will create (via the current source 328a, e.g. the resistor $R_3$) an opposed compensation current $I_{DC}$ having the same amplitude, thereby cancelling the DC/low frequency part $I_{IN,DC}$ of the current $I_{IN}$ at the input IN, i.e.:

$$I_{DC} = -I_{IN,DC} \qquad (2)$$

As mentioned in the foregoing, the current $I_{IN}$ at the input of the transimpedance amplifier circuit 32a may be provided by a photodiode PD connected to the input IN via switching means 30.

Figure 5:
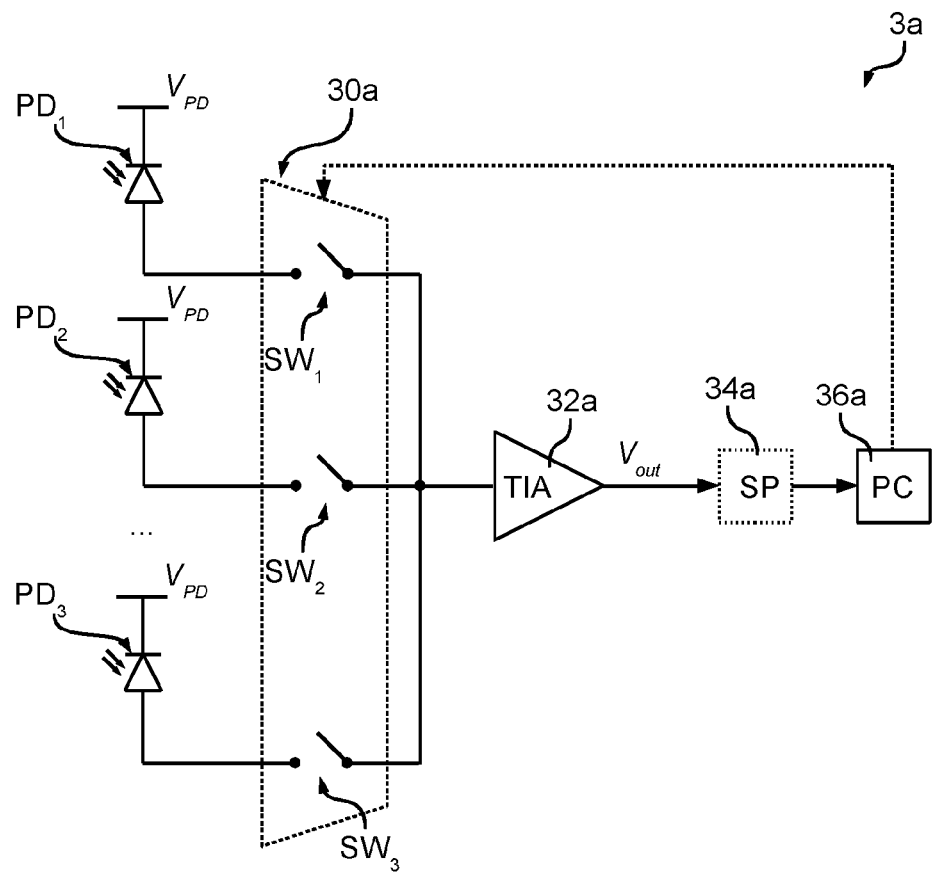
FIG. 5 shows an embodiment of a receiver circuit comprising the transimpedance amplifier circuit of FIG. 4.

For example, FIG. 5 shows an embodiment of an optical receiver circuit 3a comprising a plurality of current sources, e.g. light sensors, such as three photodiodes $PD_1$, $PD_2$ and $PD_3$, e.g. IR photodiodes, which are connected through switching means 30a to the input IN of the transimpedance amplifier circuit 32a.

As mentioned before, the switching means 30a may be configured to connect a one of the light sensors $PD_1$, $PD_2$ and PD to the input of the transimpedance amplifier circuit 32a. Accordingly, in various embodiments, at each instant, only a single light sensor $PD_1$, $PD_2$ and $PD_3$ is connected to the input of the transimpedance amplifier circuit 32a.

For example, in the embodiment considered, the switching means 30a comprise an electronic switch $SW_1$, $SW_2$ and $SW_3$ for each of the photodiodes $PD_1$, $PD_2$ and $PD_3$, which permit to:

connect the anode of a respective photodiode $PD_1$, $PD_2$ and $PD_3$ to the input IN of the transimpedance amplifier circuit 32a, or disconnect the anode of the respective photodiode $PD_1$, $PD_2$ and $PD_3$ from the input IN of the transimpedance amplifier circuit 32a.

Accordingly, in the example considered, the transimpedance amplifier 32a converts the current $I_{IN}$ provided by the photodiode PD currently connected to the input IN of the transimpedance amplifier circuit 32a into a corresponding voltage signal $V_{out}$ being indicative of the intensity of light received by the respective photodiode(s) PD.

In the embodiment considered, a processing circuit 36a, which generally may be any analog and/or digital circuit, such as a micro-processor, e.g. a DSP (Digital Signal Processor), elaborates the voltage signal $V_{out}$, e.g. in order to detect and analyze a light pulse in the received signal.

Generally, also further analog and/or digital signal processing stages 34a may be provided between the transimpedance amplifier circuit 32a and the processing circuit 36a, such as one or more amplifier stages and/or filters, such as bandpass filters, and/or an analog-to-digital converter.

In the embodiment considered, the processing circuit 36a may select the light sources PD connected to the input IN of the transimpedance amplifier circuit 32a by controlling the switching of the switching means 30a.

Figure 6:
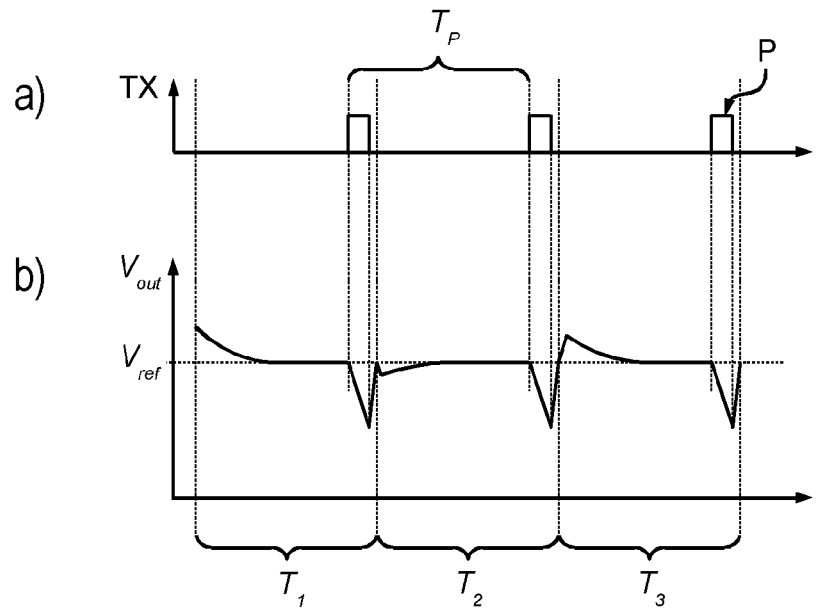
FIG. 6 shows an exemplary waveform of the output signal of a transimpedance amplifier circuit.

For example, as shown in FIG. 6, the processing circuit 36a may connect to the input IN:

during a time frame $T_1$, only the light source/photodiode $PD_1$, during a following time frame $T_2$, only the light source/photodiode $PD_2$, during a following time frame $T_3$, only the light source/photodiode $PD_3$.

For example, in various embodiments, the time frames have the same duration/frame time and are repeated periodically.

As mentioned in the foregoing, the light source/photodiode PD may be used to detect a pulse P transmitted e.g. periodically with a given period $T_P$. For example, portion a) of FIG. 6 shows an exemplary waveform for the transmitted signal TX comprising pulses P.

In various embodiments, the above frame time may thus correspond to the repetition period $T_P$ or a multiple thereof.

For example, in various embodiments, the repetition period of the pulse P may be fixed and configured within the processing circuit 36a. However, the processing circuit 36a may also determine the repetition period $T_P$ of the pulse P by analyzing the received signal $V_{out}$.

In various embodiments, the processing circuit 36a may synchronize the switching of the switching means with the repetition period of the pulse P, e.g. in order to ensure that the pulse P is at the end of the time frame.

Accordingly, as shown in portion b) of FIG. 6, once a given light source/photodiode PD is connected to the transimpedance amplifier circuit 32a, the output voltage $V_{out}$ will exhibit a potential spike due to the variation of the DC offset in the input current $I_{IN}$, which in general may be different for the various light sources/photodiodes PD. Accordingly after a given settling time, the output voltage $V_{out}$ will stabilize at the voltage $V_{ref}$ and, once a pulse P is received, the input current $I_{IN}$ is varied rapidly which is visible in the output voltage $V_{out}$. For example, in the embodiment considered in FIG. 4, a negative variation will be created in the output voltage $V_{out}$.

Accordingly, in the embodiment considered, the settling time of the transimpedance amplifier circuit 32a, i.e. the time required to generate the current $I_{DC}$ once a different light source/photodiode PD has been connected to the input IN of the transimpedance amplifier circuit 32a should be smaller than the frame time in order to permit a reliable detection of the pulse P.

For example, assuming ideal operational amplifiers, the loop gain $G_{LOOP}$ of the circuit of FIG. 4 may be approximated with the following equations, with $R_2=R_1$ and $C_2=C_1$:

$$G_{LOOP} = \frac{R_F}{R_3} \cdot \frac{1}{(1+s \cdot C_F \cdot R_F)} \cdot \frac{1}{s \cdot C_1 \cdot R_1} \quad (3)$$

and the gain G may be approximated as:

$$G = \frac{V_{out}}{I_{IN}} \cong \frac{s \cdot C_1 \cdot R_1 \cdot R_3}{\left(1 + s \frac{C_1 \cdot R_1 \cdot R_3}{R_F}\right) \cdot (1 + s \cdot C_F \cdot R_F)} \quad (4)$$

The approximation of equation (4) is usually satisfied in a proper amplifier design, because the first pole of equation (4):

$$p_1 = -R_F/(C_1 \cdot R_1 \cdot R_2)$$

should be significantly smaller than the second pole $$p_2 = -1/(R_F \cdot C_F).$$

In fact, from a design point of view, the frequency $f_2$ of the second pole $p_2$ of the transfer function should be chosen high enough in order to get the main energy contributions of the input current pulse, thereby improving the signal to noise ratio. For the same reason, the first pole frequency $f_1$ should be properly low. Nevertheless, a too low value for this pole frequency is usually not advisable, because not enough attenuation would be performed at low frequencies. Moreover, the time constant of this pole sets the settling time for the DC input current integration.

Accordingly, the circuit shown in FIG. 4 has the drawback that setting the gain loop unity gain frequency (f1) to optimize the transimpedance gain, the resulting settling time may be longer than the required frame time. A missing (and often non-linear) settling will also degrade overall dynamic range.

For example, choosing $f_1=50$ kHz to maximize the signal "capturing" according to its spectral density, the time constant would be in the order of 3.2 us whereas the frame time may be 8 us or less.

Accordingly, the circuit shown in FIG. 4 may be faced with an unsolvable trade-off in the transfer functions between signal integration requirements and settling time.

In various embodiments, the settling time of the transimpedance amplifier circuit 32a is improved by reducing the time constants of the differential integrator 322a/324a during a pre-charge phase.

Figure 7:
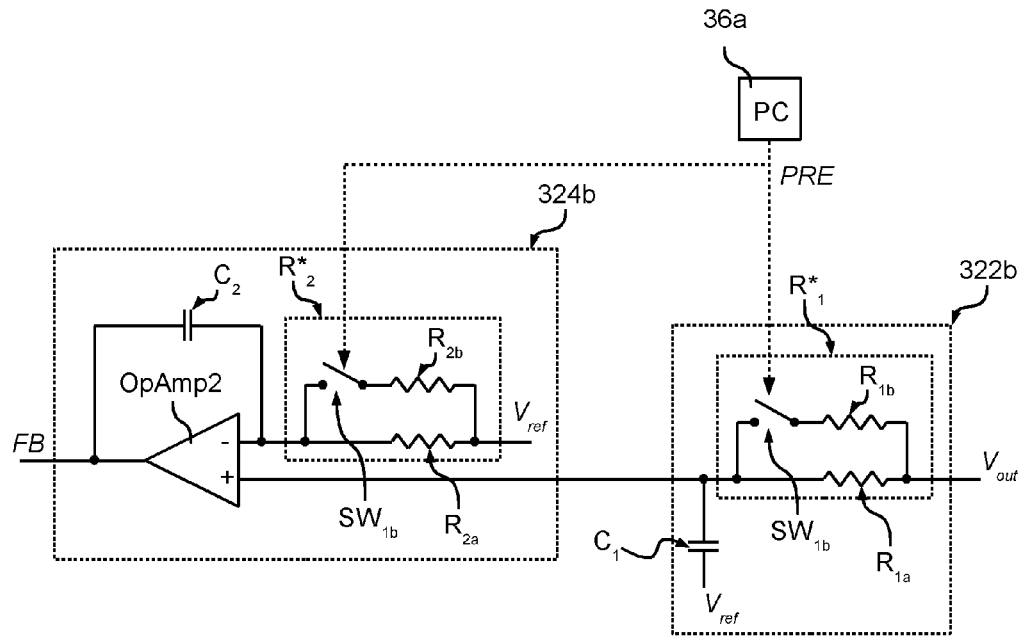
FIGS. 7, 8, 9 and 10 show embodiments of various circuits adapted to be used in the transimpedance amplifier circuit of FIG. 4.

For example, FIG. 7 shows an embodiment, which is based on the exemplary circuits of the differential integrator 324a/322a of FIG. 4.

Specifically, in the embodiment considered, the modified low-pass filter 322b of the differential integrator uses as resistor $R_1$, now referred to as a resistor $R^*_1$, a resistor with variable resistance value. For example, in the embodiment considered, the variable resistor $R^*_1$ is implemented with a first resistor $R_{1a}$ and a second resistor and $R_{1b}$, which may be connected through an electronic switch $SW_{1b}$ in parallel with the first resistor $R_{1a}$ as a function of a control signal PRE.

Similarly, also the modified error amplifier 324b of the differential integrator may use as resistor $R_2$, now referred to as a resistor $R^*_2$, with variable resistance value. Similarly, also the variable resistor $R^*_2$ may be implemented with a first resistor $R_{2a}$ and a second resistor and $R_{2b}$, which may be connected through an electronic switch $SW_{1b}$ in parallel with the first resistor $R_{2a}$ as a function of a control signal PRE.

Accordingly, when the control signal PRE has a first logic level, the resistances of the variable resistors $R^*_1$ and $R^*_2$ correspond to the resistance of the resistors $R_{1a}$ and $R_{2a}$, respectively, which thus corresponds to the configuration shown in FIG. 4. Conversely, when the control signal PRE has a second logic level, the resistances of the variable resistors $R^*_1$ and $R^*_2$ is reduced by connecting the resistors $R_{1b}$ and $R_{2b}$ in parallel with the resistors $R_{1a}$ and $R_{2a}$, respectively.

Accordingly, in the embodiment considered, the time constant of the differential integrator 322b/324b may be reduced, thereby varying the feedback control signal FB faster.

For example, in various embodiments, the control signal PRE may be provided by the processing circuit 36a, which is configured to set the control signal PRE to the second logic level during the initial part of the time frames $T_1$, $T_2$, $T_3$, e.g. when a different light source/photodiode PD has been connected to the input IN of the transimpedance amplifier circuit 32a, and to the first logic level during the remainder of the time frames $T_1$, $T_2$, $T_3$, thereby reducing the settling time at the beginning of the time frame without affecting the signal integration behavior during normal operation when a pulse P may be transmitted.

Figure 8:
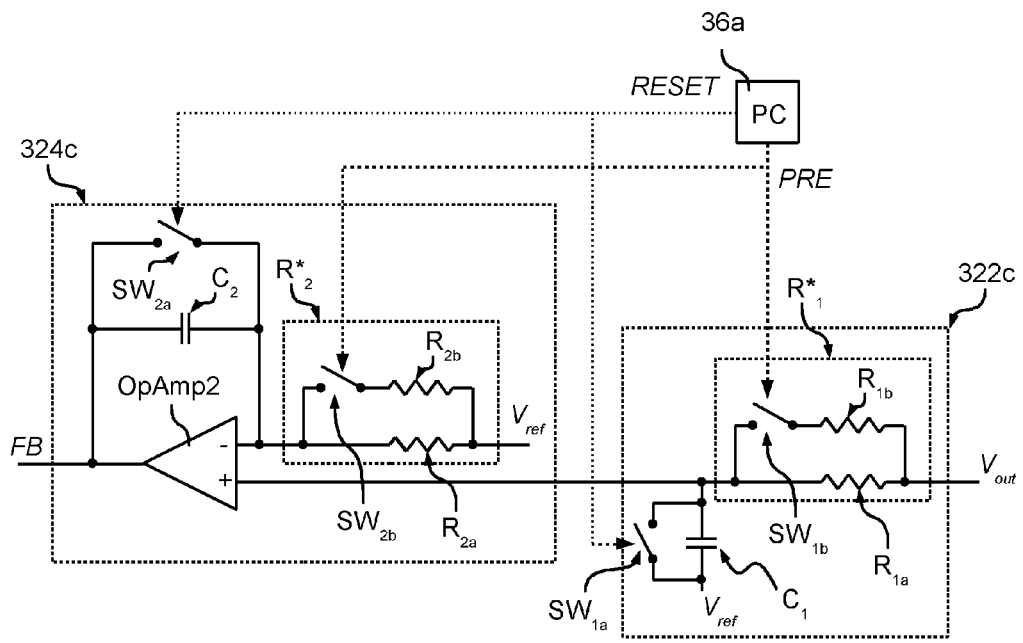

FIG. 8 shows a second embodiment of differential integrator 322c/324c.

Specifically, in the embodiment considered, the differential integrator 322c/324c is configured to reset its capacitors as a function of a reset signal RESET.

For example, in the embodiment considered, the capacitors $C_1$ and $C_2$ have associated therewith respective electronic switches $SW_{1a}$ and $SW_{2a}$ configured to short-circuit the respective capacitors $C_1$ or $C_2$ as a function of the reset signal RESET.

Accordingly, when the reset signal RESET has a first logic level, the capacitors $C_1$ or $C_2$ may be charged as discussed with respect to FIG. 4 and, when the reset signal RESET has a second logic level, the capacitors $C_1$ or $C_2$ are discharged.

For example, in various embodiments, the reset signal RESET may be provided by the processing circuit 36a, which is configured to set the control signal RESET to the second logic level before the pre-charge phase is started, i.e. during the initial part of the time frames $T_1$, $T_2$, $T_3$, e.g. when a different light source/photodiode PD has been connected to the input IN of the transimpedance amplifier circuit 32a, and to the first logic level during the remainder of the time frames $T_1$, $T_2$, $T_3$.

Accordingly, in various embodiments, the processing unit 36a may be configured to:

a) when a new time frame starts and/or when a different current source PD is connected to the transimpedance amplifier circuit 32a, set the reset signal RESET to the second logic value, thereby discharging the capacitors of the differential integrator 322c/324c;

b) after a given time period, set the reset signal RESET to the first logic value, thereby permitting a charging of the capacitors of the differential integrator 322c/324c;

c) while the reset signal RESET is set to the second logic value, or even once the reset signal RESET is set again to the first logic value, set the control signal PRE to the second logic level, thereby reducing the time constants of the differential integrator 322c/324c and consequently the duration of the settling time; and d) after a given time period, setting the control signal PRE to the first logic value, thereby permitting a normal operation of the differential integrator 322c/324c used for the final settling and to detect a pulse P in the received signal $V_{out}$, or generally a (higher frequency) variation of the input current $I_{IN}$.

Accordingly, during a reset phase (driven by the reset signal RESET), the capacitors of the differential integrator 322c/324c are reset, i.e. discharged, and, during a pre-charge phase (driven by the control signal PRE), the capacitors of the differential integrator 322c/324c are charged with a smaller time constant. Generally, the reset and pre-charge function may be used separately, or preferably in combination as shown with respect to the circuit of FIG. 8 permitting both functions.

In various embodiments, also the behavior of the transimpedance amplifier 320a may be adapted during the reset and/or pre-charge phases.

Specifically, in various embodiments, the gain of the transimpedance amplifier 320 is variable.

Figure 9:
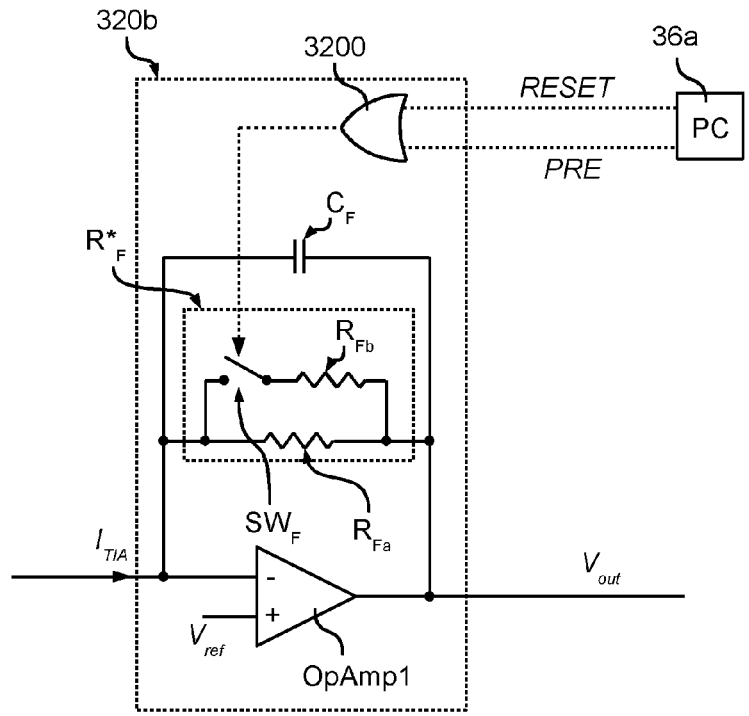

For example, FIG. 9 shows an embodiment of a transimpedance amplifier 320b with variable gain, which again is based just by way of example on the circuits shown in FIG. 4.

Specifically, in the embodiment considered, the modified transimpedance amplifier 320b uses as feedback resistor $R_F$, now referred to as a resistor $R^*_F$, with variable resistance value. For example, in the embodiment considered, the variable resistor $R^*_F$ is implemented with a first resistor $R_{Fa}$ and a second resistor $R_{Fb}$, which may be connected through an electronic switch $SW_F$ in parallel with the first resistor $R_F$.

Accordingly, when the control signal for the electronic switch $SW_F$ has a first logic level, the resistance of the variable resistor $R^*_F$ corresponds to the resistance of the resistors $R_{Fa}$, which represents the configuration shown in FIG. 4. Conversely, when the control signal for the electronic switch $SW_F$ has a second logic level, the resistance of the variable resistor $R^*_F$ is reduced by connecting the resistors $R_{Fb}$ in parallel with the resistor $R_{Fa}$.

Accordingly, in the embodiment considered, the gain of the transimpedance amplifier 320b may be reduced, which may be useful for stability purposes during the pre-charge stage. Moreover, the reduced resistance value of the resistors $R^*_F$ may be used to discharge (at least in part) the capacitor $C_F$ during the reset phase.

Accordingly, in various embodiments, the electronic switch $SW_F$ is usually opened and closed when the reset signal RESET is set to the second logic value (reset phase) and/or when the control signal PRE is set to the second logic level (pre-charge phase). For example, this operation may be implemented with a combinational logic 3200 (e.g., within the transimpedance amplifier 320b or the processing unit 36a), such as an OR gate, configured to receive at input the signals RESET and PRE and providing at output the control signal for the switch $SW_F$.

Accordingly, when using the circuits 320b, 322c and 324c in the arrangement of FIG. 4, the integration capacitances (in particular $C_1$ and $C_2$ in the embodiment considered) are discharged first by setting the reset signal RESET to the second logic level. Moreover, for stability issues, the reset signal RESET is used to set the gain of the transimpedance amplifier 320b to a low value. After this phase, the processing unit sets the reset signal RESET to the first logic level and (e.g. contemporaneously) the pre-charge signal PRE to the second logic level, which starts the pre-charge phase. Specifically, in the embodiment considered, the transimpedance amplifier 320b is kept in the low gain configuration through the (small) feedback resistance $R^*_F$, while the reset of the integration capacitances (in particular $C_1$ and $C_2$ in the embodiment considered) is released and the integration resistance values (in particular $R^*_1$ and $R^*_2$ in the embodiment considered) are reduced by putting smaller resistors $R_{1b}$ and $R_{2b}$ in parallel with the resistors $R_{1a}$ and $R_{2a}$. Finally, after a given time period, the pre-charge phase ends by setting the signal PRE to the first logic value and the circuit is again in the normal configuration discussed with respect to FIG. 4, which may be used to detect a pulse in the received signal.

Accordingly, when looking at the previous formulas (3) and (4), the modified frequency $f_1^*$ may be moved to a higher frequency than in the effective configuration, by properly choosing the values of $R^*_F$, $R^*_1$ and $R^*_2$. Accordingly, a faster settling of the transimpedance amplifier circuit 32a may be achieved, while maintaining the circuit topology and the stability during normal operation.

The inventors have observed that the modified circuits may not properly deal with the equivalent input voltage offset of the two operational amplifiers.

For example, in the exemplary circuit shown in FIGS. 7, 8 and 9, once the pre-charge phase ends, it is likely that there will still flow a current through the feedback resistance $R_F/R_F^*$, which is proportional to the sum of the operational amplifier offsets $\Delta V_{OS}$ of the operational amplifier OpAmp1 and OpAmp2. Accordingly, when the transimpedance amplifier 320b is switched to the operative configuration, this current (that usually cannot be integrated quickly) will act as an equivalent step signal over the feedback resistance $R_F$ and the output voltage of the transimpedance amplifier 320b will respond to this signal through its effective transfer function. For example, if $R_1^*=10$ k$\Omega$ and $\Delta V_{OS}=1$ mV, the unwanted current signal is in the order of 100 nA (nanoampere), which may correspond to 10% of the effective full-scale.

So, the offset voltages may cause a not-negligible perturbation after the pre-charge phase that in most cases may only be recovered through a slow time constant. The resulting settling error before the next pulse transmission may thus be affected by this non-ideality, so compromising the effect of the pre-charge phase.

In various embodiments, this issue may be reduced or solved, by an offset-compensation phase, in which the configuration of the differential integrator $322a/324a$ may be changed.

Figure 10:
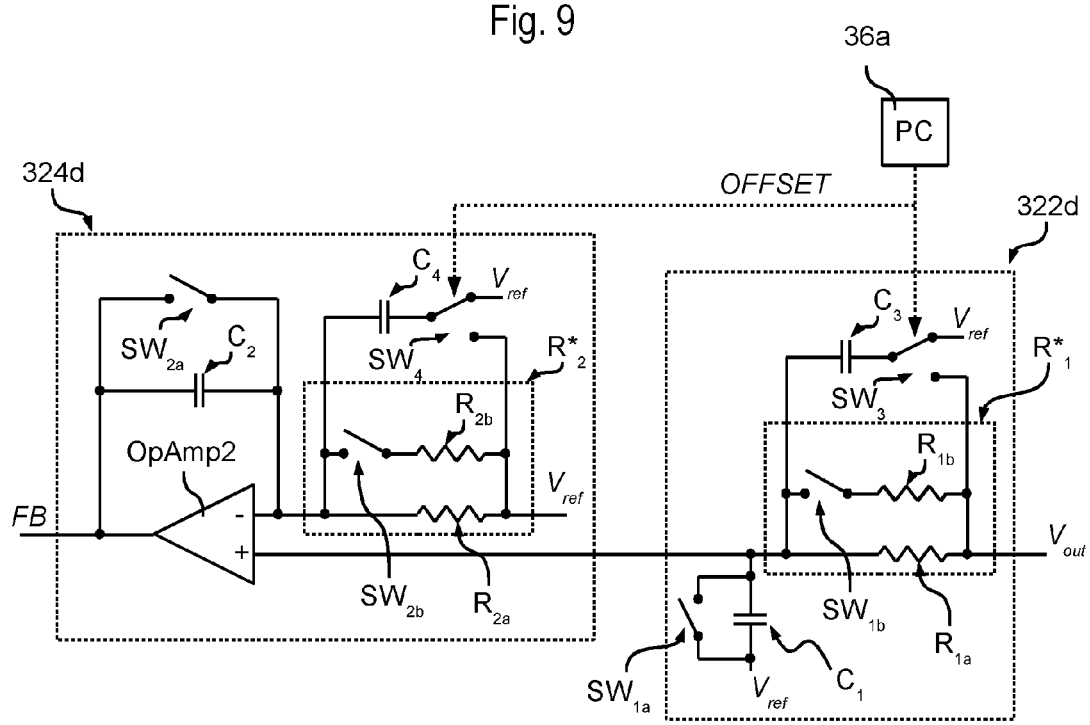

For example, FIG. 10 shows an embodiment of a differential integrator $322d/324d$, which again is based just by way of example on the circuits shown in FIG. 4. Generally, the circuits may also comprise the reset and/or pre-charge circuit shown in FIGS. 7 and 8.

Specifically, in the embodiment considered, the low-pass-filter $322d$ of the differential integrator $322d/324d$ comprises a capacitor $C_3$ and an electronic switch $SW_3$ configured to connect the capacitor $C_3$ in parallel with the resistor $R_1/R^*_1$. Specifically, in the embodiment considered, a first terminal of the capacitor $C_3$ is connected to the inverting input of the operational amplifier OpAmp2, and the second terminal of the capacitor $C_3$ is connected via the electronic switch $SW_3$ either to the reference voltage $V_{ref}$ or to the resistor $R_1/R^*_1$. Accordingly, the capacitor $C_3$ can be seen as a fraction of the integration capacitance $C_1$, so no impact for the chip-area is required.

Similarly, the error amplifier $324d$ of the differential integrator $322d/324d$ may comprise a capacitor $C_4$ and an electronic switch $SW_4$ configured to connect the capacitor $C_4$ in parallel with the resistor $R_2/R^*_2$. Specifically, in the embodiment considered, a first terminal of the capacitor $C_4$ is connected to the non-inverting input of the operational amplifier OpAmp2, and the second terminal of the capacitor $C_4$ is connected via the electronic switch $SW_4$ either to the reference voltage $V_{ref}$ or to the resistor $R_2/R^*_2$. Accordingly, in the embodiment considered, the capacitor $C_4$ is switched from $V_{ref}$ to $V_{ref}$ which is not required from a functional point of view, but is helpful in order to keep the symmetry of the differential integrator, thereby permitting also second order improvements (such as charge injections, etc.). Generally, the switch $SW_4$ may thus also be omitted and the capacitor $C_4$ may always be connected in parallel with the resistor $R_2/R^*_2$.

As mentioned in the foregoing, the low-pass filter $322d$ and the error amplifier $324d$ implement together a differential integrator. Accordingly, in various embodiments, the capacitance of the capacitor $C_4$ corresponds to the capacitance of the capacitor $C_3$.

Accordingly, when the control signal OFFSET used to drive the switches $SW_3$ and $SW_4$ has a first logic level, the capacitors $C_3$ and $C_4$ are connected between the inputs of the operational amplifier OpAmp2 and $V_{ref}$.

Conversely, when the control signal OFFSET has a second logic level, the capacitors $C_3$ and $C_4$ are connected in parallel with the resistors $R_1$ (in particular $R_{1a}$ in the embodiment considered) and $R_2$ (in particular $R_{ea}$ in the embodiment considered), respectively. In this case, the transfer function and the loop gain function of the amplifier circuit $32a$ are changed, with $C_3=C_4$ and $R_1=R_2$:

$$G_{LOOP} = \frac{R_F}{R_3} \cdot \frac{1}{(1+s \cdot C_F \cdot R_F)} \cdot \frac{1+s \cdot C_3 \cdot R_3}{s \cdot C_1 \cdot R_1} \quad (5)$$

and the gain G may be approximated as:

$$G = \frac{V_{out}}{I_{IN}} \cong \frac{s \cdot C_1 \cdot R_1 \cdot R_3}{\left[1+s\left(\frac{C_1 \cdot R_1 \cdot R_3}{R_F}+C_3 \cdot R_1\right)\right] \cdot (1+s \cdot C_F \cdot R_F)} \quad (6)$$

Accordingly, by choosing the capacitances $C_3$ and $C_4$, while keeping the stability of the loop, it is possible to strongly attenuate the response to the offset voltage dependent current signal (after the end of the pre-charge phase). In fact, as shown by equation (6), the "integration" bandwidth will be strongly reduced. Then, the perturbation exploited by the amplifier circuit will be significantly reduced, because the recovery time constant remains (practically) unchanged, but the value to recover is significantly smaller than the previous one, thereby permitting a residual error at the end of the settling time which remains acceptable.

Figure 11:
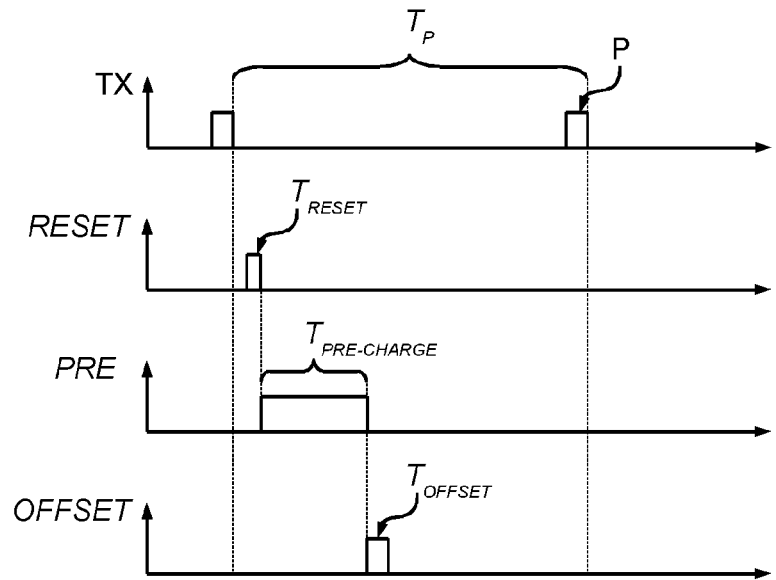
FIG. 11 shows waveforms of various control signals used by the circuits of FIGS. 7, 8, 9 and 10.

Accordingly, as shown in FIG. 11, the processing unit $36a$ may be configure to generate the signals RESET, PRE and OFFSET, which are usually set to the first logic level (e.g. low) and sequentially to the second logic level (e.g. high), thereby activating for respective time periods $T_{RESET}$, $T_{PRE\text{-}CHARGE}$ and $T_{OFFSET}$ in sequence the reset, pre-charge and offset-compensation phase. Generally, the pre-charge phase should be sufficiently long in order to permit a smoothing of the output perturbation.

In various embodiments, the settling time may be further reduced. Generally, this mechanism may be used in any of the embodiments shown in FIG. 4, 7, 8, 9 or 10, i.e. with or without the reset, pre-charge and/or offset-compensation phase.

Figure 12:
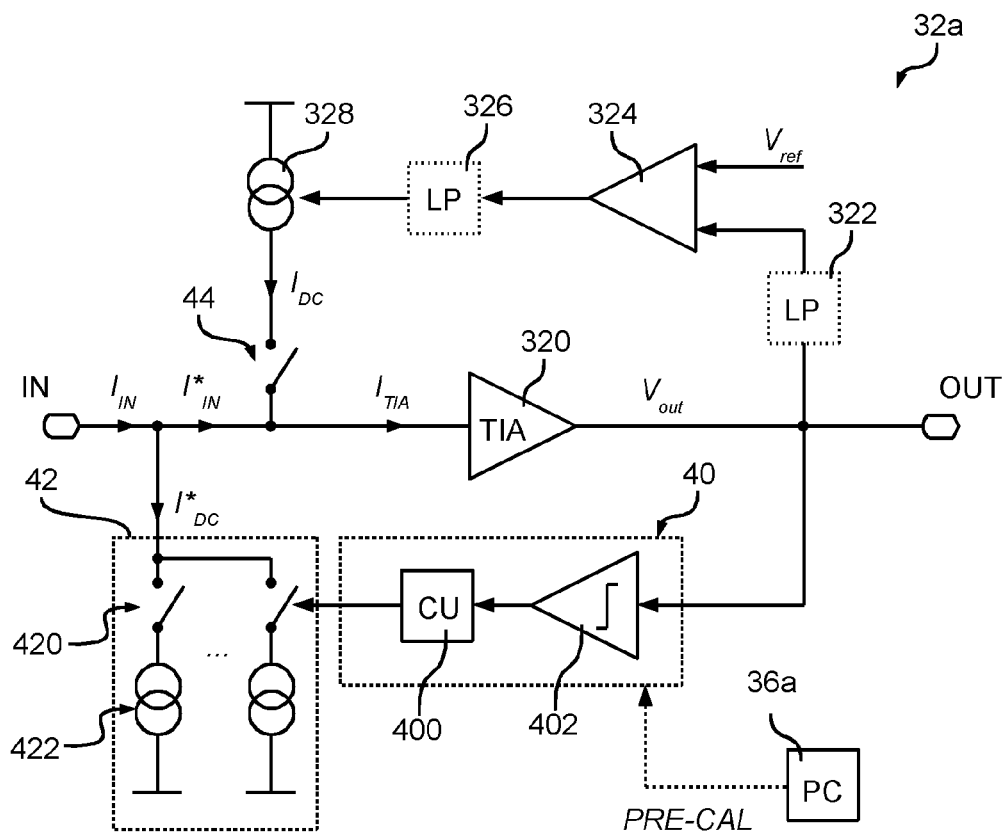
FIG. 12 shows a second embodiment of a transimpedance amplifier circuit.

Specifically, as shown in FIG. 12, in various embodiments, the transimpedance amplifier circuit $32a$ comprises in addition to the previously described control loop 322, 324, 326 and 328 (and the respective embodiments described with respect to FIG. 4, 7, 8, 9 or 10), a second feedback control loop configured to perform a first rough DC offset compensation.

Specifically, in the embodiment considered, the second control loop comprises a control part 40 and a variable current source 42 generating a compensation current $I^*_{DC}$. For example, in the embodiment considered, the variable current source 42 is implemented with a plurality of constant current sources 422, which may be connected selectively to the input IN of the transimpedance amplifier circuit $32a$ via respective switching means 420. Accordingly, the previously described first control loop operates in this case with a current $I^*_{IN}=I_{IN}-I^*_{DC}$. Generally, each of the constant current sources 422 may be configured to provide a respective current, which is different for each constant current sources 422.

In the embodiment considered, the control part 40 comprises a comparator 402, such as a comparator with hysteresis, such as a Schmitt trigger, and a control unit (CU) 400. Generally, the operation amplifier OpAmp1 of the transimpedance amplifier 320 may also be reconfigured and used as comparator 402.

Accordingly, in the embodiment considered, the comparator 402 will generate a signal indicating whether the output voltage $V_{out}$ is smaller or greater than a given threshold.

Accordingly, during a first compensation phase, the control unit 400 may increase the current $I^*_{DC}$, e.g. by connecting each time an additional current source 422 to the input IN, or changing the type and/or or number of current sources 422 connected to the input IN, until the comparator 402 indicates that the output voltage $V_{out}$ is smaller than the respective threshold. In fact, knowing the expected minimum-maximum range of the DC current, the variable current source 42 may be designed quiet easily, e.g. usually a few (3-4) constant current sources 422 are sufficient.

Accordingly, in the embodiment considered, the control unit 400 and the variable current source 42 may represent a SAR (Successive-approximation-register) current digital-to-analog converter.

In various embodiment, the control part 40 is enabled via a control signal PRE-CAL, i.e. the current $I^*_{DC}$ remains stable when the control signal PRE-CAL has a first logic value and may be varied when the control signal PRE-CAL has a second logic value.

In various embodiment, the signal PRE-CAL may also be used to disable the first control loop. For example, in the embodiment considered, an electronic switch 44 is connected between the current generator 328 and the input node, which thus disconnects the current generator 328 when the signal PRE-CAL has the second logic value. Accordingly, the transimpedance amplifier 320 acts as a preamplifier for the comparator 402 and the control unit 400 is able to decide the sign of the difference between the background current and the cancellation current.

Figure 13:
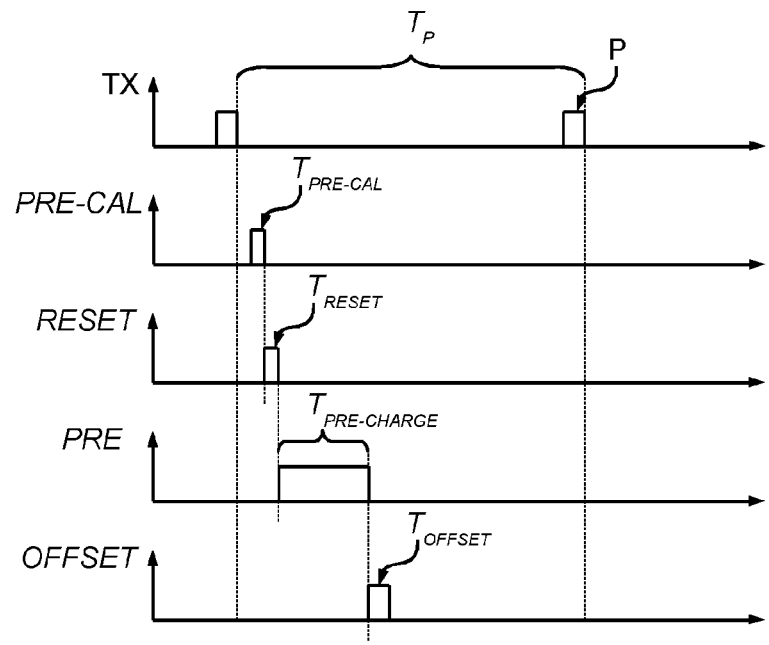
FIG. 13 shows waveforms of various control signals used by the transimpedance amplifier circuit of FIG. 12.

For example, this control signal PRE-CAL may also be generate by the processing unit 36a. For example, as shown in FIG. 13, the control signal PRE-CAL may be set to the second logic level before the previously described reset, pre-charge and offset-compensation phases are started, i.e. these phases operate already with the pre-compensate current $I^*_{IN}$, i.e. only a residual background current has to be canceled through the first control loop.

For example, in various embodiment, the second control loop is configured to maintain a residual background current $I^*_{IN}$ with the same sign of the effective one $I_{IN}$.

The previously described embodiment has also the advantage, that the maximum background current to be compensated by the first control loop is limited and e.g. the value of the resistance $R_3$ may be increased, thereby improving the dynamic range of the whole amplifier circuit 32a.

Figure 14:
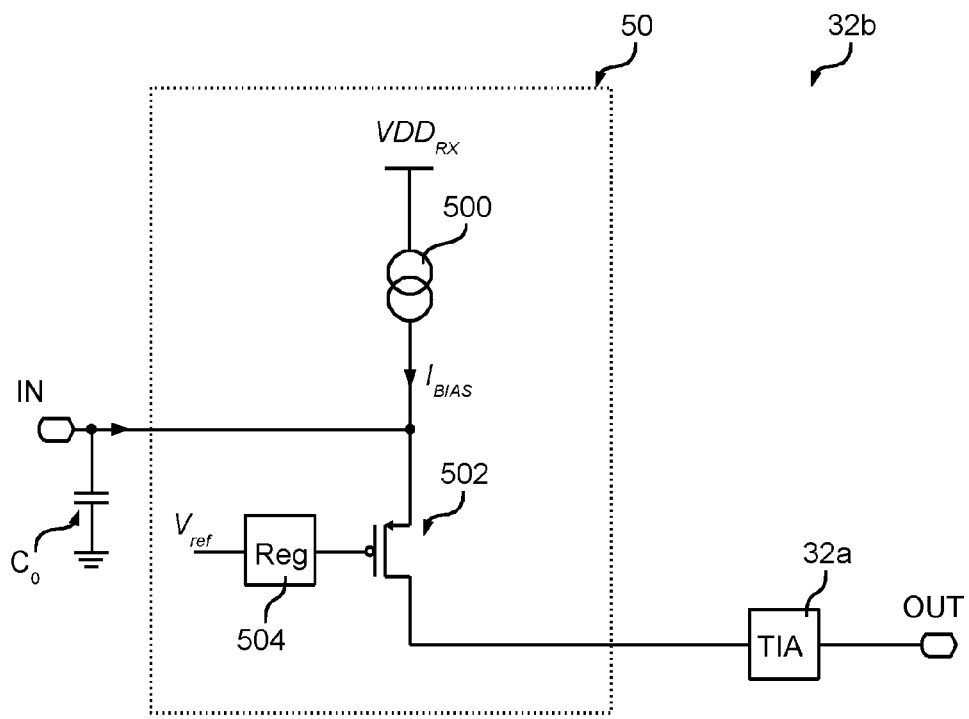
FIG. 14 shows a third embodiment of a transimpedance amplifier circuit.

Finally, as shown in FIG. 14, another minor bottleneck may be found in the parasitic capacitance $C_0$ associated with the input IN of the transimpedance amplifier circuit 32a. This capacitance $C_0$ (typically in the order of some tens of pF) depends e.g. on pad capacitance, PCB trace, photodiode capacitance.

Specifically, FIG. 14 shows a modified transimpedance amplifier circuit 32b, which comprises, in addition to any one of the previously described transimpedance amplifier circuit 32a, a circuit 50 connected between the input IN and the input of the transimpedance amplifier circuit 32a.

Specifically, in the embodiment considered, the circuit 50 comprises a regulated cascode 502 with associated regulation (Reg) unit 504 and current bias generator 500. Cascode or regulated-cascode configurations are a well-known solution to read a signal current and they allow performing this current read-out through a quite low input impedance so leading to a good decoupling with respect to input capacitance. Otherwise, this capacitance put at the input of a traditional structure may limit the stability and the bandwidth of the TIA. Basically, the cascode allows decoupling the parasitic capacitance $C_0$, acting as a simple current transfer.

For example, the steering current DAC 40/42 (see FIG. 12) can be used for both to keep (always) biased the source follower arrangement and to act as current compensation DAC during the effective framework.

Of course, without prejudice to the principle of the invention, the details of construction and the embodiments may vary widely with respect to what has been described and illustrated herein purely by way of example, without thereby departing from the scope of the present invention, as defined by the ensuing claims.

The invention claimed is:

1. A transimpedance amplifier circuit, comprising:
an input terminal for receiving an input current and an output terminal for providing an output voltage;
a transimpedance amplifier comprising an input connected to said input terminal and configured to provide at an output said output voltage, whereby said output voltage is indicative of an input current received at the input of said transimpedance amplifier;
a feedback control loop configured to generate a compensation current at the input of said transimpedance amplifier in order reduce or cancel a DC/low frequency part of said input current, wherein said feedback control loop comprises:
a) a differential integrator generating a feedback signal by comparing said output voltage with a reference voltage; and
b) a current generator configured to generate said compensation current as a function of said feedback signal;
wherein said differential integrator comprises an integrating error amplifier comprising a first operational amplifier, wherein a first input of said first operational amplifier is connected via a first resistor to a reference voltage and a second input of said first operational amplifier is connected to the output voltage, and wherein at least one integration capacitor is connected between an output terminal of said first operational amplifier and said first input of said first operational amplifier;
wherein a time constant associated with charging said at least one integration capacitor is variable as a function of a pre-charge control signal; and
a processing circuit configured to generate said pre-charge control signal such that:
during a pre-charge phase, said pre-charge control signal is set to a first value to set the time constant associated with charging said at least one integration capacitor to a first time constant value; and
during an operation phase, said pre-charge control signal is set to a second value to increasing the time constant associated with charging said at least one integration capacitor to a second time constant value greater than the first time constant value for said pre-charge phase.

2. The transimpedance amplifier circuit according to claim 1, wherein said first resistor is a variable resistor having a resistance that is settable as a function of said pre-charge control signal.

3. The transimpedance amplifier circuit according to claim 1, wherein said differential integrator comprises a low-pass filter arranged at said second input of said first operational amplifier, wherein said low-pass filter comprises a second resistor and a second integration capacitor.

4. The transimpedance amplifier circuit according to claim 3, comprising an offset compensation capacitor connected with a first terminal to said second input of said first operational amplifier and with a second terminal to an electronic switch, said electronic switch being configured to connect said second terminal of said offset compensation capacitor either to said reference voltage or said second resistor as a function of an offset compensation signal, wherein said processing circuit is configured to generate said offset compensation signal to connect said offset compensation capacitor in parallel with said second resistor during an offset compensation phase following said pre-charge phase.

5. The transimpedance amplifier circuit according to claim 1, comprising a discharge circuit configured to selectively discharge said at least one integration capacitor as a function of a reset signal, wherein said processing circuit is configured to generate said reset signal in order to discharge said at least one integration capacitor during a reset phase preceding said pre-charge phase.

6. The transimpedance amplifier circuit according to claim 1, wherein said transimpedance amplifier has a variable gain that is set at least as a function of said pre-charge control signal.

7. The transimpedance amplifier circuit according to claim 1, wherein said transimpedance amplifier comprises a second operational amplifier, wherein a first input of said second operational amplifier is connected to said input terminal and a second input of said second operational amplifier is connected to the reference voltage, and wherein a third resistor is connected between an output terminal of said second operational amplifier and said first input of said second operational amplifier.

8. The transimpedance amplifier circuit according to claim 7, wherein said third resistor is a variable resistor having a resistance that is set as a function of said pre-charge control signal.

9. The transimpedance amplifier circuit according to claim 1, comprising a further control loop that is activated during a pre-compensation phase preceding said pre-charge phase, said further control loop comprising:
 a plurality of constant current sources selectively connectable to the input of said transimpedance amplifier;
 a comparator configured to generate a comparison signal indicating whether the output voltage is smaller than a threshold; and
 a control unit configured to selectively connect sub-sets of said constant current sources to the input of said transimpedance amplifier, thereby increasing current provided by said plurality of constant current sources, until said comparison signal indicates that the output voltage is smaller than said threshold.

10. The transimpedance amplifier circuit according to claim 1 implemented as an integrated circuit.

11. The transimpedance amplifier circuit according to claim 1, wherein the transimpedance amplifier circuit is a component of a receiver circuit.

12. A method of operating a transimpedance amplifier circuit including a transimpedance amplifier and a feedback control loop including a differential integrator with an integration capacitor coupled between an input and an output of the differential integrator, the method comprising:
 during a pre-charge phase, setting a pre-charge control signal to a first value so as to set a time constant associated with charging said integration capacitor to a first time constant value;
 during an operation phase, setting said pre-charge control signal to a second value so as to increase the time constant associated with charging said integration capacitor to a second time constant value greater than the first time constant value for said pre-charge phase, wherein the feedback control loop has a smaller settling time for reducing or cancelling a DC/low frequency part of an input current applied to the transimpedance amplifier during said pre-charge phase, and
 wherein the feedback control loop is maintained stable during said operation phase.

13. A circuit, comprising:
 a transimpedance amplifier having an input and an output;
 a feedback circuit having an input coupled to the output of the transimpedance amplifier and an output coupled to an input of the transimpedance amplifier, wherein said feedback circuit comprises:
  a low pass filter including a first capacitor coupled to a first variable resistor, the low pass filter having an input coupled to the input of the feedback circuit; and
  a differential integrator having a first input coupled to an output of the low pass filter, a second input coupled a second variable resistor, an output coupled to the output of the feedback circuit, and a second capacitor coupled between the output of the differential integrator and the second input of the differential integrator; and
 a control circuit configured to set first resistance values for the first and second variable resistors when the circuit is operating in a pre-charge phase and set second resistance values for the first and second variable resistors when the circuit is operating is an operating phase.

14. The circuit of claim 13, further comprising:
 a first discharge circuit configured to discharge the first capacitor;
 a second discharge circuit configured to discharge the second capacitor; and
 wherein the control circuit is further configured to actuate the first and second discharge circuits during a reset phase preceding the pre-charge phase.

15. The circuit of claim 13, further comprising:
 a third capacitor;
 a first switch circuit configured to selectively couple the third capacitor in parallel with the first variable resistor;
 a fourth capacitor;
 a second switch circuit configured to selectively couple the fourth capacitor in parallel with the second variable resistor; and
 wherein the control circuit is further configured to actuate the first and second switch circuits during an offset phase following the pre-charge phase.

16. The circuit of claim 15, wherein the first and second switch circuits, when not actuated, couple the third and fourth capacitors to a reference voltage.

17. The circuit of claim 13, wherein the transimpedance amplifier comprises a third variable resistor coupled between the input and the output of the transimpedance amplifier, and wherein the control circuit is further configured to set one resistance value for the third variable resistor when the circuit is operating in the pre-charge phase and set another resistance value for the third variable resistor when the circuit is not operating is the pre-charge phase.

18. A transimpedance amplifier circuit, comprising:
 an input terminal for receiving an input current and an output terminal for providing an output voltage;
 a transimpedance amplifier comprising an input connected to said input terminal and configured to provide at an output said output voltage, whereby said output voltage is indicative of an input current received at the input of said transimpedance amplifier;
 a feedback control loop configured to generate a compensation current at the input of said transimpedance amplifier in order reduce or cancel a DC/low frequency part of said input current, wherein said feedback control loop comprises:
- a) a differential integrator generating a feedback signal by comparing said output voltage with a reference voltage; and
- b) a current generator configured to generate said compensation current as a function of said feedback signal;

wherein said differential integrator comprises at least one integration capacitor;

wherein a time constant associated with charging said at least one integration capacitor is variable as a function of a pre-charge control signal;

wherein said transimpedance amplifier has a variable gain that is set at least as a function of said pre-charge control signal;

a processing circuit configured to generate said pre-charge control signal such that:
- during a pre-charge phase, said pre-charge control signal is set to a first value to set the time constant associated with charging said at least one integration capacitor to a first time constant value; and
- during an operation phase, said pre-charge control signal is set to a second value to increasing the time constant associated with charging said at least one integration capacitor to a second time constant value greater than the first time constant value for said pre-charge phase;

wherein said transimpedance amplifier comprises a second operational amplifier, a first input of said second operational amplifier being connected to said input terminal and a second input of said second operational amplifier being connected to the reference voltage; and a third resistor connected between an output terminal of said second operational amplifier and said first input of said second operational amplifier.

19. The transimpedance amplifier circuit according to claim 18, wherein said third resistor is a variable resistor having a resistance that is set as a function of said pre-charge control signal.

20. A transimpedance amplifier circuit, comprising:
an input terminal for receiving an input current and an output terminal for providing an output voltage;
a transimpedance amplifier comprising an input connected to said input terminal and configured to provide at output said output voltage, whereby said output voltage is indicative of an input current received at the input of said transimpedance amplifier;
a feedback control loop configured to generate a compensation current at the input of said transimpedance amplifier in order reduce or cancel a DC/low frequency part of said input current, wherein said feedback control loop comprises:
- a) a differential integrator generating a feedback signal by comparing said output voltage with a reference voltage; and
- b) a current generator configured to generate said compensation current as a function of said feedback signal;

wherein said differential integrator comprises at least one integration capacitor;

wherein a time constant associated with charging said at least one integration capacitor is variable as a function of a pre-charge control signal;

wherein said transimpedance amplifier has a variable gain that is directly set as a function of said pre-charge control signal; and a processing circuit configured to generate said pre-charge control signal such that:
- during a pre-charge phase, said pre-charge control signal is set to a first value to set the time constant associated with charging said at least one integration capacitor to a first time constant value; and
- during an operation phase, said pre-charge control signal is set to a second value to increasing the time constant associated with charging said at least one integration capacitor to a second time constant value greater than the first time constant value for said pre-charge phase.

21. The transimpedance amplifier circuit according to claim 20, further comprising a further control loop that is activated during a pre-compensation phase preceding said pre-charge phase, said further control loop comprising:
a plurality of constant current sources selectively connectable to the input of said transimpedance amplifier;
a comparator configured to generate a comparison signal indicating whether the output voltage is smaller than a threshold; and
a control unit configured to selectively connect sub-sets of said constant current sources to the input of said transimpedance amplifier, thereby increasing current provided by said plurality of constant current sources, until said comparison signal indicates that the output voltage is smaller than said threshold.

22. The transimpedance amplifier circuit according to claim 20, wherein said transimpedance amplifier comprises a second operational amplifier, wherein a first input of said second operational amplifier is connected to said input terminal and a second input of said second operational amplifier is connected to the reference voltage, and wherein a third resistor is connected between an output terminal of said second operational amplifier and said first input of said second operational amplifier.

23. The transimpedance amplifier circuit according to claim 22, wherein said third resistor is a variable resistor having a resistance that is set as a function of said pre-charge control signal.

* * * * *

UNITED STATES PATENT AND TRADEMARK OFFICE
CERTIFICATE OF CORRECTION

PATENT NO. : 10,187,026 B2  
APPLICATION NO. : 15/587579  
DATED : January 22, 2019  
INVENTOR(S) : Marco Zamprogno et al.

Page 1 of 1

It is certified that error appears in the above-identified patent and that said Letters Patent is hereby corrected as shown below:

On the Title Page

(54) should read:
TRANSIMPEDANCE AMPLIFIER CIRCUIT, RELATED INTEGRATED CIRCUIT, RECEIVER CIRCUIT AND METHOD OF OPERATING A TRANSIMPEDANCE AMPLIFIER CIRCUIT

In the Specification

At Column 13, Line number 58, please replace the term [[ $R_{ea}$ ]] with -- $R_{2a}$ --

At Column 14, Line number 43, please replace the term [[ $I^*_{Dc}$ ]] with -- $I^*_{DC}$ --

Signed and Sealed this
Second Day of July, 2019

Andrei Iancu
*Director of the United States Patent and Trademark Office*